(12) United States Patent
Isaka et al.

(10) Patent No.: US 8,383,930 B2
(45) Date of Patent: Feb. 26, 2013

(54) SOLAR CELL AND METHOD FOR PRODUCING SOLAR CELL

(75) Inventors: Takayuki Isaka, Kashihara (JP); Yoshiya Abiko, Gose (JP); Yoshifumi Tonomura, Sakurai (JP)

(73) Assignee: Sharp Kabushiki Kaisha, Osaka (JP)

( * ) Notice: Subject to any disclaimer, the term of this patent is extended or adjusted under 35 U.S.C. 154(b) by 1483 days.

(21) Appl. No.: 11/665,015

(22) PCT Filed: Oct. 13, 2005

(86) PCT No.: PCT/JP2005/018847
§ 371 (c)(1),
(2), (4) Date: Apr. 10, 2007

(87) PCT Pub. No.: WO2006/046407
PCT Pub. Date: May 4, 2006

(65) Prior Publication Data
US 2009/0007966 A1    Jan. 8, 2009

(30) Foreign Application Priority Data
Oct. 27, 2004    (JP) .................................. 2004-312140

(51) Int. Cl.
*H01L 31/052* (2006.01)
*H01L 31/0264* (2006.01)
*H01L 31/18* (2006.01)

(52) U.S. Cl. ........ 136/256; 136/258; 136/259; 136/361; 427/569; 257/E31.004; 438/57; 438/69; 438/72

(58) Field of Classification Search .................. 136/256, 136/259, 261; 257/E31.004; 427/569; 438/57, 438/68, 72
See application file for complete search history.

(56) References Cited

U.S. PATENT DOCUMENTS

2001/0050404 A1    12/2001  Saito et al.
2004/0112426 A1 *  6/2004   Hagino .................. 136/261

FOREIGN PATENT DOCUMENTS

| JP | 4-107881 | 4/1992 |
|----|----------|--------|
| JP | 4-296063 | 10/1992 |
| JP | 10-107306 A | 4/1998 |
| JP | 2002-57352 A | 2/2002 |
| JP | 2002-111016 A | 4/2002 |
| JP | 2002-164556 A | 6/2002 |
| JP | 2002-270879 | 9/2002 |
| JP | 2002-277605 A | 9/2002 |
| JP | 2002270879 A * | 9/2002 |
| JP | 2003-303985 A | 10/2003 |
| JP | 2004-39751 | 2/2004 |

(Continued)

OTHER PUBLICATIONS

Ruby et al., "Recent progress on the self-aligned, selective emitter silicon solar cell", 26th IEEE Photovoltaics Specialists Conference, Sep. 1997.*

(Continued)

*Primary Examiner* — Jennifer Michener
*Assistant Examiner* — Matthew Martin
(74) *Attorney, Agent, or Firm* — Nixon & Vanderhye P.C.

(57) ABSTRACT

Disclosed is a solar cell including a passivation film formed on a light-receiving surface of a silicon substrate, and an antireflection film formed on the passivation film, wherein the passivation film has a refractive index higher than that of the antireflection film. The passivation film and the antireflection film can each be made of a silicon nitride film.

7 Claims, 5 Drawing Sheets

FOREIGN PATENT DOCUMENTS

| | | |
|---|---|---|
| JP | 2004-47776 A | 2/2004 |
| JP | 2004-128438 | 4/2004 |

OTHER PUBLICATIONS

International Search Report for PCT/JP2005/018847 mailed Jan. 17, 2006.

Yamamoto et al., "Passivation Effect of Plasma Chemical Vapor Deposited $SiN_x$ on Single-Crystalline Silicon Thin-Film Solar Cells", Japanese Journal of. Applied Physic, vol. 42, pp. 5135-5139 (2003).

Ghannam et al., "Comparison between different schemes for passivation of multicrystalline silicon solar cells by means of hydrogen plasma and front side oxidation", Applied Physics Letters, vol. 62, No. 11, pp. 1280-1282 (1993).

Zhao et al., "24.7% Efficient Perl Silicon Solar Cells and Other High Efficiency Solar Cell and Module Research At the University of New South Wales", International Solar Energy Society Solar World Congress 1999 Module-View Documents.

Schmidt et al. "Surface passivation of silicon solar cells using plasma-enhanced chemical-vapour-deposited SiN films and thin thermal $SiO_2$/plasma SiN stacks", Semiconductor Science and Technology, vol. 16, pp. 164-170 (2001).

Lee et al., "Double-layer Anti-Reflection Coating Using $MgF_2$ and $CeO_2$ Films on a Crystalline Silicon Substrate", Thin Solid Films, vol. 376, No. 1-2, Nov. 12000, pp. 208-215.

EP Search Report mailed Oct. 26, 2007 in corresponding EP Application 05793185.9.

Lee et al., "Double-layer Anti-Reflection Coating Using $MgF_2$ and $CeO_2$ Films on a Crystalline Silicon Substrate", Thin Solid Films, vol. 376, No. 1-2, November 12000, pp. 208-215.

Holt et al, "Hot-Wire Chemical Vapor Deposition of High Hydrogen Content Silicon Nitride for Solar Cell Passivation and Anti-Reflection Coating Applications", Thin Solid Films, vol. 430, No. 1-2, Apr. 22, 2003, pp. 37-40.

Leguijt et al, "Low Temperature Surface Passivation for Silicon Solar Cells", Sol Energy Materials and Solar Cells, Elsevier Science Publishers, Amsterdam, NL, vol. 40, No. 4, Aug. 1, 1996, pp. 297-345.

Buie et al, "Full Day Simulations of Anti-Reflection Coating for Flat Plate Silicon Photovoltaics", Solar Energy Materials and Solar Cells, Elsevier Science Publishers, Amsterdam, NL, vol. 81, No. 1, Jan. 25, 2004, pp. 13-24.

\* cited by examiner

SOLAR CELL AND METHOD FOR PRODUCING SOLAR CELL

This application is the U.S. national phase of International Application No. PCT/JP2005/018847 filed 13 Oct. 2005 which designated the U.S. and claims priority to JP 2004-312140 filed 27 Oct. 2004, the entire contents of each of which are hereby incorporated by reference.

TECHNICAL FIELD

The technology presented herein relates to a solar cell and a method for producing a solar cell. More particularly, the technology relates to a solar cell with improved maximum electric power and a method for producing the solar cell.

BACKGROUND

Recently, development of clean energy has been desired to address global environmental problems such as depletion of energy resources and increase of $CO_2$ in the air. In particular, a solar cell using a silicon substrate (hereinafter also referred to as a silicon solar cell) has been developed and put into practical use as a new energy source, pursuing the path of development.

In order to improve the maximum electric power of a silicon solar cell, attempts have been made to prevent loss of minority carriers not only within a silicon substrate but also on a surface of a silicon substrate. In particular, for the prevention of loss of minority carriers on a surface of a silicon substrate, there has been developed a passivation technique forming a silicon oxide film on a surface of a silicon substrate to prevent recombination of minority carriers (see for example Non-Patent Document 1). Further, there has also been developed a passivation technique forming a silicon nitride film on a surface of a silicon substrate (see for example Non-Patent Document 2).

Non-Patent Document 1: Jianhua Zhao, Aihua Wang, Martin A. Green, "24.7% EFFICIENT PERL SILICON SOLAR CELLS AND OTHER HIGH EFFICIENCY SOLAR CELL AND MODULE RESEARCH AT THE UNIVERSITY OF NEW SOUTH WALES", ISES Solar World Congress, Jerusalem, Israel, 1999.

Non-Patent Document 2: Jan Schmidt, Mark Kerr, Andres Cuevas, "Surface passivation of silicon solar cells using plasma-enhanced chemical-vapour-deposited SiN films and thin thermal $SiO_2$/plasma SiN stacks", Semicond. Sci. Technol., 16 (2001), pp. 164-170.

PROBLEMS TO BE SOLVED AND SUMMARY

When a silicon oxide film is formed on a surface of a silicon substrate as a passivation film preventing recombination of minority carriers on the surface of the silicon substrate as described in Non-Patent Document 1, the silicon oxide film also serves as an antireflection film preventing reflection of sunlight. However, since the silicon oxide film is not so effective in preventing reflection of sunlight and has a high reflectance to sunlight, the maximum electric power cannot be obtained sufficiently.

Further, when a silicon nitride film is formed on a surface of a silicon substrate as a passivation film as described in Non-Patent Document 2, the silicon nitride film also serves as an antireflection film preventing reflection of sunlight. Although the effect of passivation (prevention of recombination of minority carriers on a surface of a silicon substrate) increases with an increase in refractive index of the silicon nitride film, significant amount of sunlight is lost due to absorption in the silicon nitride film with a high refractive index. Therefore, the maximum electric power cannot be obtained sufficiently.

One feature of an example embodiment presented herein is to provide a solar cell with improved maximum electric power and a method for producing the solar cell.

An example embodiment presented herein is a solar cell including a passivation film formed on a light-receiving surface of a silicon substrate, and an antireflection film formed on the passivation film, wherein the passivation film has a refractive index higher than that of the antireflection film.

In the solar cell of the example embodiment, the passivation film and the antireflection film can each be made of a silicon nitride film.

Further, in the solar cell of the example embodiment, the passivation film preferably has a film thickness of not more than 10 nm.

Further, in the solar cell of the example embodiment, the passivation film preferably has a refractive index of not less than 2.6.

Further, the example embodiment is a method for producing the solar cell according to any of the above descriptions, including the steps of: forming the passivation film on the light-receiving surface of the silicon substrate by plasma CVD using a first gas; and forming the antireflection film on the passivation film by plasma CVD using a second gas having a composition different from that of the first gas. In the method for producing the solar cell of the present invention, it is satisfactory as long as at least one of types of components constituting the second gas and quantitative relationship between the components is different from those in the first gas.

In the method for producing the solar cell of the example embodiment, an RF power density in forming the passivation film is preferably lower than an RF power density in forming the antireflection film.

Further, in the method for producing the solar cell of the example embodiment, a film-forming chamber used for forming the passivation film may be different from a film-forming chamber used for forming the antireflection film.

Further, in the method for producing the solar cell of the example embodiment, the first gas and the second gas can include silane gas and ammonia gas.

According to an example embodiment presented herein, a solar cell with improved maximum electric power and a method for producing the solar cell can be provided.

DESCRIPTION OF THE REFERENCE SIGNS

Figure 1:
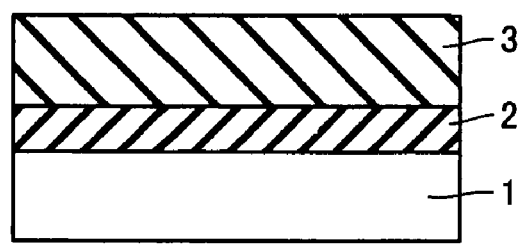
FIG. 1 is a schematic cross-sectional view of a portion of an exemplary solar cell of an example embodiment.

1 silicon substrate, 2, 6 passivation film, 3 antireflection film, 4 p+ layer, 5 n+ layer, 7 p electrode, 8 n electrode, 9 film-forming chamber, 10 lower electrode, 11 upper electrode, 12 gas inlet.

Hereinafter, example embodiments will be described. In the drawings identical or corresponding parts will be designated by the same reference characters.

FIG. 1 is a schematic cross-sectional view of a portion of an exemplary solar cell of an example embodiment presented herein. The solar cell of the example embodiment includes a silicon substrate 1, a passivation film 2 made of a silicon nitride film formed on a light-receiving surface (a surface on which sunlight is incident) of silicon substrate 1, and an antireflection film 3 made of a silicon nitride film formed on passivation film 2. The solar cell has a characteristic that passivation film 2 has a refractive index higher than that of antireflection film 3.

With this structure, recombination of minority carriers on the light-receiving surface of silicon substrate 1 can effectively be prevented by passivation film 2 made of a silicon nitride film with a refractive index higher than that of antireflection film 3, without deteriorating the effect of preventing reflection of sunlight by antireflection film 3 made of a silicon nitride film. As a result, the maximum electric power of the solar cell can be improved.

Figure 2:
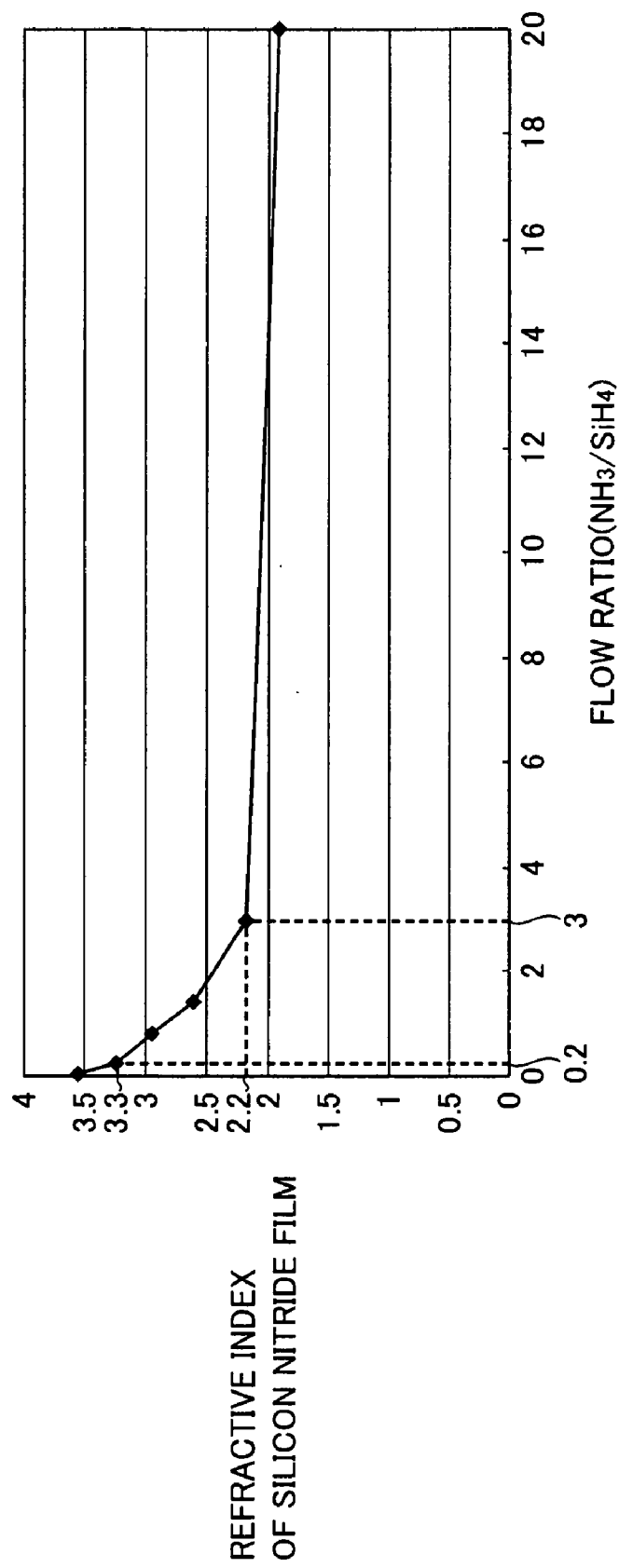
FIG. 2 shows the relationship between flow ratio between gases ($NH_3/SiH_4$) introduced when a silicon nitride film is formed by plasma CVD using $SiH_4$ gas and $NH_3$ gas and refractive index of the formed silicon nitride film.

FIG. 2 shows the relationship between flow ratio between gases ($NH_3/SiH_4$) introduced when a silicon nitride film is formed by plasma CVD using silane ($SiH_4$) gas and ammonia ($NH_3$) gas and refractive index of the formed silicon nitride film. The axis of ordinate represents the refractive index of the formed silicon nitride film, and the axis of abscissa represents the flow ratio of $NH_3$ gas to $SiH_4$ gas ($NH_3/SiH_4$).

As shown in FIG. 2, the refractive index of the formed silicon nitride film tended to decrease with an increase in flow ratio between the gases ($NH_3/SiH_4$). Accordingly, it becomes possible to form a passivation film made of a silicon nitride film with a high refractive index on a light-receiving surface of a silicon substrate and form an antireflection film made of a silicon nitride film with a low refractive index on the passivation film by plasma CVD, by changing the composition of the gases introduced into a plasma CVD apparatus. The refractive index of the silicon nitride film shown in FIG. 2 was measured by ellipsometry using an ellipsometer having a He—Ne laser (wavelength: 632.8 nm) as a light source.

Figure 3:
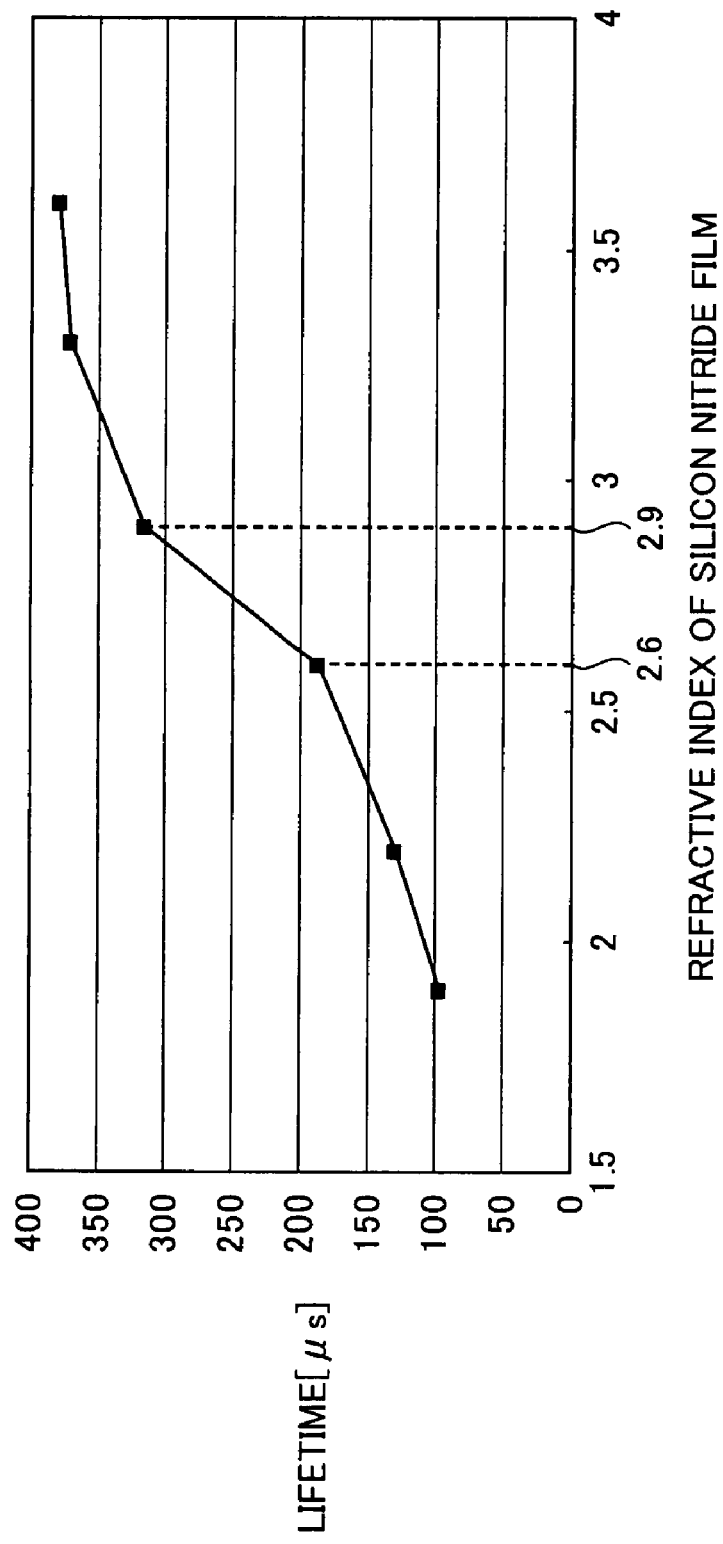
FIG. 3 shows the relationship between refractive index of a silicon nitride film and lifetime of minority carriers when silicon nitride films having different refractive indexes are each formed on a surface of a silicon substrate by plasma CVD.

FIG. 3 shows the relationship between refractive index of a silicon nitride film and lifetime of minority carriers when silicon nitride films having different refractive indexes are each formed on a surface of a silicon substrate by plasma CVD, by changing the composition of the gases. The axis of ordinate represents the lifetime of minority carriers, and the axis of abscissa represents the refractive index of the silicon nitride film.

As shown in FIG. 3, the lifetime of minority carriers tended to increase with an increase in refractive index of the silicon nitride film formed on the surface of the silicon substrate. In particular, the lifetime of minority carriers tended to increase significantly when the refractive index of the nitride silicon film was not less than 2.6, more preferably not less than 2.9.

In this manner, there is a tendency that recombination of minority carriers can further be prevented when a silicon nitride film formed on a light-receiving surface of a silicon substrate has a high refractive index. However, since a silicon nitride film with a high refractive index readily absorbs sunlight, it is preferable that the silicon nitride film formed on the light-receiving surface of the silicon substrate has a film thickness of not more than 10 nm, to reduce loss of sunlight due to absorption. Further, to reduce loss of sunlight due to reflection, it is more preferable to form a silicon nitride film with a refractive index of not less than 1.8 and not more than 2.3 and a film thickness of not less than 50 nm and not more than 100 nm as an antireflection film on a passivation film.

The refractive index of the silicon nitride film shown in FIG. 3 was measured by ellipsometry using an ellipsometer having a He—Ne laser (wavelength: 632.8 nm) as a light source. The lifetime of minority carriers shown in FIG. 3 was measured by microwave reflectometry using a lifetime measuring apparatus having a laser with a wavelength of 904 nm.

Further, it is preferable that RF (radio frequency) power density in forming a passivation film on a light-receiving surface of a silicon substrate by plasma CVD is set as low as possible. In this case, the silicon substrate can be less damaged when the passivation film is formed thereon, and thereby a silicon nitride film having an excellent passivation effect can be formed.

EXAMPLES

Example 1

Firstly, in order to remove slice damage from an n-type monocrystalline silicon substrate in the shape of a square of 12.5 cm by 12.5 cm sliced to have a thickness of 250 μm, surfaces of the silicon substrate were etched with a NaOH solution until the silicon substrate had a thickness of 200 μm. Then, a silicon oxide film was formed on each of a light-receiving surface and a rear surface of the silicon substrate to serve as a diffusion mask. Next, an acid-resistant resist was patterned by photolithography onto the silicon oxide film on the rear surface of the silicon substrate, and the exposed silicon oxide film was etched with hydrofluoric acid. Subsequently, vapor phase diffusion of $BBr_3$ was performed in an atmosphere at 970° C. for 50 minutes to form a comb-like p+ layer on the etched rear surface of the silicon substrate.

Thereafter, a silicon oxide film was formed again on each of the front surface and the rear surface of the silicon substrate, and the silicon oxide film on the rear surface of the silicon substrate was etched into a desired shape in the same way as in forming the p+ layer. Subsequently, vapor phase diffusion of $POCl_3$ was performed in an atmosphere at 970° C. for 20 minutes to form a comb-like n+ layer, which faces the p+ layer so as not to overlap each other, on the etched rear surface of the silicon substrate.

Next, in order to perform texturing on the front surface (light-receiving surface) opposite to the rear surface of the silicon substrate, a silicon oxide film with a thickness of 800 nm was formed on the rear surface of the silicon substrate by APCVD (atmospheric pressure chemical vapor deposition) as a protective film, and the silicon substrate was immersed in a KOH solution with a KOH concentration of 2.5% by mass at 80° C. for 45 minutes to be subjected to texturing on the light-receiving surface of the silicon substrate. Thereafter, the protective film on the rear surface of the silicon substrate was removed with a HF solution with a HF concentration of 10% by mass.

Subsequently, the silicon substrate was placed in an atmosphere of oxygen at 800° C. for 30 minutes to form a silicon oxide film with a thickness of 10 nm as a passivation film on each of the light-receiving surface and the rear surface of the silicon substrate. Then, a silicon oxide film with a thickness of 400 nm was formed on the passivation film on the rear surface of the silicon substrate by APCVD, as a protective film. Thereafter, in order to form a silicon nitride film on the light-receiving surface of the silicon substrate, the silicon substrate was immersed in a HF solution with a HF concentration of 10% by mass for one minute to remove the silicon oxide film on the light-receiving surface of the silicon substrate.

Figure 4:
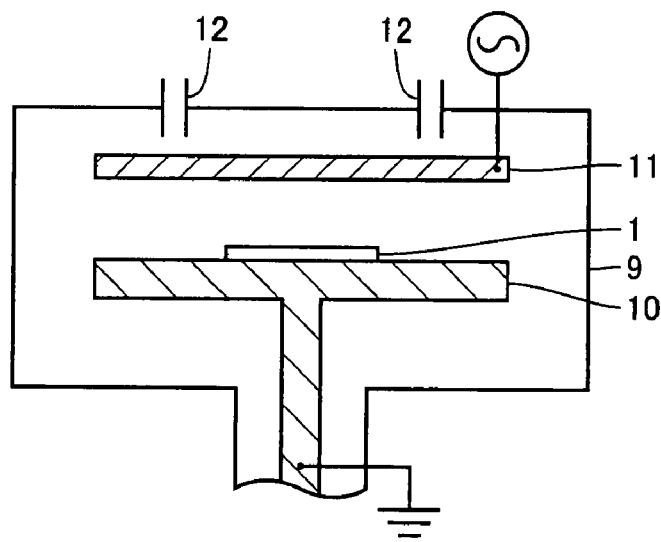
FIG. 4 is a schematic cross-sectional view of an exemplary apparatus used for forming a passivation film and an antireflection film in examples of an example embodiment.

Next, an apparatus shown in a schematic cross-sectional view of FIG. 4 was used to form a passivation film made of a silicon nitride film by plasma CVD on the front surface (light-receiving surface) of the silicon substrate opposite to the rear surface having the p+ layer and the n+ layer formed thereon. The apparatus shown in FIG. 4 includes a film-forming chamber 9, and a lower electrode 10 and an upper electrode 11 provided inside film-forming chamber 9. Silicon substrate 1 having the p+ layer and the n+ layer formed thereon was placed on lower electrode 10 inside film-forming chamber 9, and $SiH_4$ gas and $NH_3$ gas were introduced from a gas inlet 12 with a flow ratio ($NH_3/SiH_4$) of 0.2. Then, a radio frequency voltage was applied across lower electrode 10 and upper electrode 11 at an RF power density of 350 W/m$^2$. Thereby, a silicon nitride film with a film thickness of 5 nm (refractive index: 3.3) was formed as a passivation film on the light-receiving surface of silicon substrate 1.

Thereafter, film-forming chamber 9 was once evacuated, and then $SiH_4$ gas and $NH_3$ gas were introduced again from gas inlet 12 with a flow ratio ($NH_3/SiH_4$) of 3. Then, a radio frequency voltage was applied across lower electrode 10 and upper electrode 11 at an RF power density of 350 W/m$^2$. Thereby, a silicon nitride film with a film thickness of 73 nm (refractive index: 2.2) was formed as an antireflection film on the passivation film.

An acid-resistant resist was patterned by photolithography on the rear surface of the silicon substrate having the aforementioned passivation film formed thereon, and the acid-resistant resist and the passivation film were etched with hydrofluoric acid to form contact holes exposing portions in which the p+ layer and the n+ layer are formed. Next, a Ti (titanium) thin film, a Pd (palladium) thin film, and a Ag (silver) thin film were deposited in this order on the entire rear surface of the silicon substrate, from the rear surface of the silicon substrate, and then the acid-resistant resist was removed. As a result, comb-like p electrode 7 and n electrode 8 shown in a schematic plan view of FIG. 5 were formed by lift-off.

Thereafter, the silicon substrate was cut along the electrodes into a square of 12.5 cm by 12.5 cm. Thereby, a solar cell was completed.

Figure 5:
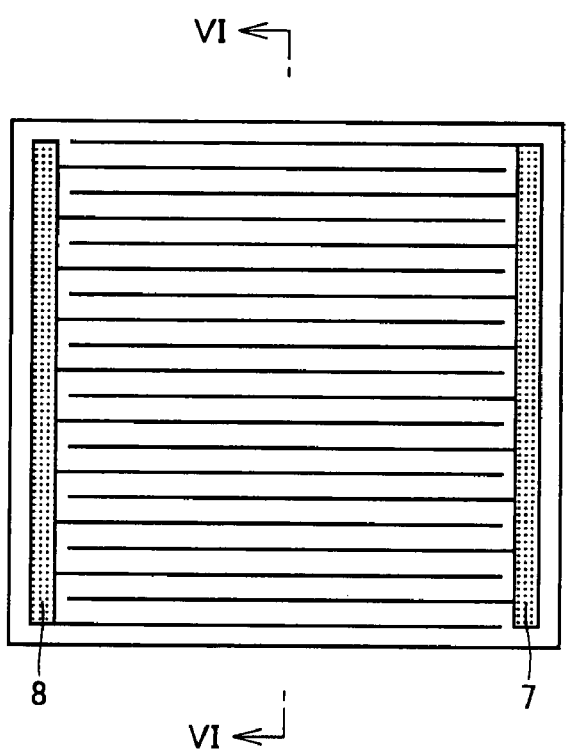
FIG. 5 is a schematic plan view of a rear surface of a solar cell produced in Example 1 of an example embodiment.
Figure 6:
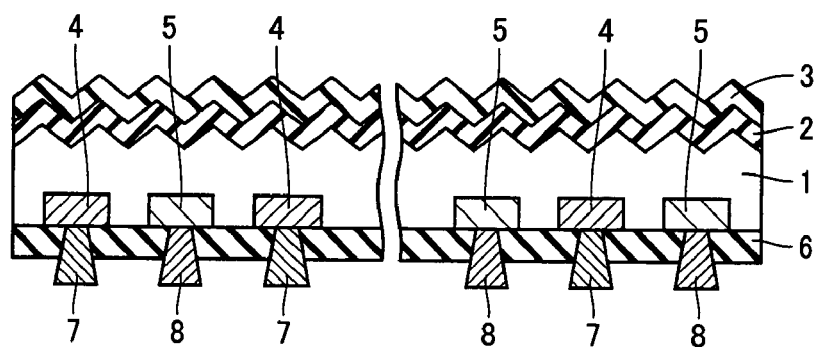
FIG. 6 is a schematic cross-sectional view of the solar cell shown in FIG. 5, taken along VI-VI.

FIG. 6 is a schematic cross-sectional view of the solar cell shown in FIG. 5, taken along VI-VI. As shown in FIG. 6, in the solar cell of Example 1, passivation film 2 and antireflection film 3 were formed sequentially on the light-receiving surface of n-type silicon substrate 1, and a p+ layer 4 and an n+ layer 5 were formed on the rear surface of silicon substrate 1. Further, a passivation film 6 was formed on the rear surface of silicon substrate 1, and p electrode 7 and n electrode 8 were formed on p+ layer 4 and n# layer 5, respectively. It is to be noted that a portion of the solar cell is schematically illustrated in FIG. 6.

Table 1 shows the results of examining properties of the solar cell. The solar cell had a short-circuit current density (Jsc) of 37.50 mA/cm$^2$, an open voltage (Voc) of 0.650 V, a fill factor (F.F) of 0.770, and the maximum electric power (Pmax) of 1.694 W.

Example 2

A solar cell was produced under the same conditions as in Example 1, except that the RF power density in forming a passivation film on a light-receiving surface of a silicon substrate was set at 140 W/m$^2$. The results of examining properties of the solar cell is also shown in Table 1. The solar cell had a short-circuit current density (Jsc) of 37.80 mA/cm$^2$, an open voltage (Voc) of 0.651 V, a fill factor (F.F) of 0.776, and the maximum electric power (Pmax) of 1.725 W.

Comparative Example 1

$SiH_4$ gas and $NH_3$ gas were introduced with a flow ratio ($NH_3/SiH_4$) of 3 to form a silicon nitride film with a film thickness of 37 nm and a refractive index of 2.2 as a passivation film on a light-receiving surface of a silicon substrate. Thereafter, a silicon nitride film with a film thickness of 37 nm and a refractive index of 2.2 was formed as an antireflection film on the passivation film, without changing the flow ratio of $NH_3$ gas to $SiH_4$ gas ($NH_3/SiH_4$). Except for the above, a solar cell was produced under the same conditions as in Example 1. The results of examining properties of the solar cell is also shown in Table 1. The solar cell had a short-circuit current density (Jsc) of 37.50 mA/cm$^2$, an open voltage (Voc) of 0.648 V, a fill factor (F.F) of 0.770, and the maximum electric power (Pmax) of 1.689 W.

TABLE 1

| | Passivation Film | | | Antireflection Film | | | Properties of Solar Cell | | | |
|---|---|---|---|---|---|---|---|---|---|---|
| | Refractive Index | Film Thickness (nm) | RF Power Density (W/m$^2$) | Refractive Index | Film Thickness (nm) | RF Power Density (W/m$^2$) | Jsc (mA/cm$^2$) | Voc (V) | F.F | Pmax (W) |
| Example 1 | 3.3 | 5 | 350 | 2.2 | 73 | 350 | 37.50 | 0.650 | 0.770 | 1.694 |
| Example 2 | 3.3 | 5 | 140 | 2.2 | 73 | 350 | 37.80 | 0.651 | 0.776 | 1.725 |
| Comparative Example 1 | 2.2 | 37 | 350 | 2.2 | 37 | 350 | 37.50 | 0.648 | 0.770 | 1.689 |

As shown in Table 1, in the solar cells of Examples 1 and 2 in which the refractive index (3.3) of the silicon nitride film as the passivation film on the light-receiving surface of the silicon substrate was higher than the refractive index (2.2) of the silicon nitride film as the antireflection film formed on the passivation film, the maximum electric power was improved as compared to that of the solar cell of the Comparative Example 1 in which the silicon nitride film formed as the passivation film and the silicon nitride film formed as the antireflection film had the same refractive index (2.2). This improvement is likely to be obtained because a silicon nitride film having a high refractive index was formed on a light-receiving surface of a silicon substrate and thereby recombination of minority carriers on the light-receiving surface of the silicon substrate was able to be prevented.

Further, as shown in Table 1, in the solar cell of Example 2 in which the RF power density in forming the silicon nitride film as the passivation film was set lower than the RF power density in forming the silicon nitride film as the antireflection film, the maximum electric power was improved as compared to that of the solar cell of Example 1 in which the passivation film and the antireflection film were both formed at the same RF power density. This improvement is likely to be obtained because the RF power density in forming the passivation film was low and thereby the silicon substrate was less damaged when the passivation film was formed.

Although a NaOH solution was used to etch the silicon substrate in the above examples, a mixed acid of a HF solution and a $HNO_3$ solution may be used for etching.

Further, although the acid-resistant resist was patterned by photolithography in the above examples, the acid-resistant resist may be patterned by printing.

Further, although vapor phase diffusion of $BBr_3$ was performed to form the p+ layer in the above examples, the p+ layer can also be formed by applying a medical solution containing a boron compound on a surface of a silicon substrate by spin coating and then annealing the silicon substrate at 700° C. to 1000° C. Furthermore, the p+ layer can also be formed by pattern-printing an aluminum paste and firing the paste.

Further, although vapor phase diffusion of $POCl_3$ was performed to form the n+ layer in the above examples, the n+ layer can also be formed by applying a medical solution containing a phosphorous compound on a surface of a silicon substrate by spin coating and then annealing the silicon substrate at 700° C. to 1000° C.

Further, although the p+ layer and the n+ layer were both formed in the shape of a comb in the above examples, the p+ layer and the n+ layer may be formed in the shape of a dot or a line. Furthermore, the p+ layer and the n+ layer may have different shapes.

Further, although the n+ layer was formed after the p+ layer was formed in the above examples, the order of forming these layers is not limited to this order, and the p+ layer may be formed after the n+ layer was formed.

Further, although a Ti thin film, a Pd thin film, and a Ag thin film were deposited and then the acid-resistant resist was removed to form the comb-like p electrode and n electrode by lift-off in the above examples, the p electrode and the n electrode can also be formed by printing a silver paste on the p+ layer and the n+ layer, drying the paste, and then firing the paste at 400° C. to 750° C. for 1 to 100 minutes.

Further, although a monocrystalline silicon substrate was used in the above examples, a polycrystalline silicon substrate can also be used.

Further, although an n-type silicon substrate was used in the above examples, a p-type silicon substrate can also be used.

Further, although the passivation film and the antireflection film were formed using the same film-forming chamber in the above examples, a film-forming chamber used for forming the passivation film may be different from a film-forming chamber used for forming the antireflection film.

Further, although a silicon nitride film was formed as a passivation film on the light-receiving surface of the silicon substrate in the above examples, a silicon oxide film may be formed as a passivation film on the light-receiving surface of the silicon substrate.

Further, passivation effect on the rear surface of the silicon substrate can be improved by increasing the refractive index of the passivation film formed on the rear surface of the silicon substrate in the above examples.

It should be understood that the disclosed embodiments and examples above are, in all respects, by way of illustration only and are not by way of limitation. The scope is set forth by the claims rather than the above description, and is intended to cover all the modifications within a spirit and scope equivalent to those of the claims.

The invention claimed is:

1. A solar cell, comprising:
    a passivation film formed on a light-receiving surface of a silicon substrate; and
    an antireflection film formed on said passivation film,
    wherein said passivation film has a refractive index higher than that of said antireflection film, wherein
    said passivation film has a refractive index of not less than 2.6.

2. The solar cell according to claim 1, wherein said passivation film and said antireflection film are each made of a silicon nitride film.

3. The solar cell according to claim 1, wherein said passivation film has a film thickness of not more than 10 nm.

4. A method for producing the solar cell according to claim 1, comprising:
    forming said passivation film on the light-receiving surface of said silicon substrate by plasma CVD using a first gas; and subsequently
    forming said antireflection film on said passivation film by plasma CVD using a second gas having a composition different from that of said first gas, so that the solar cell comprises the silicon substrate, the passivation film and the antireflection film in that order.

5. The method for producing the solar cell according to claim 4, wherein an RF power density in forming said passivation film is lower than an RF power density in forming said antireflection film.

6. The method for producing the solar cell according to claim 4, wherein a film-forming chamber used for forming said passivation film is different from a film-forming chamber used for forming said antireflection film.

7. The method for producing the solar cell according to claim 4, wherein said first gas and said second gas include silane gas and ammonia gas.

* * * * *